(12) United States Patent
Weis

(10) Patent No.: US 11,394,105 B2
(45) Date of Patent: Jul. 19, 2022

(54) COMPACT LAMINATED COMPONENT CARRIER WITH FRONT END CHIP AND IMPEDANCE MATCHING CIRCUITRY FOR ANTENNA COMMUNICATION

(71) Applicant: AT&S Austria Technologie & Systemtechnik Aktiengesellschaft, Leoben (AT)

(72) Inventor: Gerald Weis, Bruck an der Mur (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/247,394

(22) Filed: Dec. 9, 2020

(65) Prior Publication Data

US 2021/0194111 A1   Jun. 24, 2021

(30) Foreign Application Priority Data

Dec. 18, 2019 (EP) .................................... 19217655

(51) Int. Cl.
*H01Q 1/24* (2006.01)
*H01Q 1/22* (2006.01)
(Continued)

(52) U.S. Cl.
CPC ......... *H01Q 1/2283* (2013.01); *H01Q 1/2291* (2013.01); *H01Q 1/241* (2013.01);
(Continued)

(58) Field of Classification Search
CPC .... H01Q 1/2283; H01Q 1/2291; H01Q 1/241; H01Q 5/335; H01Q 23/00; H04B 1/04; H01L 2223/6677; H01L 2224/16227; H01L 2224/73267; H01L 2924/15153; H01L 2924/15321; H01L 2924/3025; H01L 23/49838; H01L 21/4857; H01L 23/49822;
(Continued)

(56) References Cited

U.S. PATENT DOCUMENTS 5,475,346 A * 12/1995 Mullett ............... H03H 7/1766
  333/25
9,935,065 B1 * 4/2018 Baheti ............... H01L 23/49822
(Continued)

FOREIGN PATENT DOCUMENTS

| EP | 1769430 A1 | 4/2007 |
| EP | 3547363 A1 | 10/2019 |
| EP | 3579334 A1 | 12/2019 |

OTHER PUBLICATIONS

Tomezak, A.; European Search Report in Application EP 19217655. 0; pp. 1-9; dated Sep. 22, 2020; European Patent Office; 80298, Munich, Germany.

*Primary Examiner* — Jean B Jeanglaude
(74) *Attorney, Agent, or Firm* — Robert A. Blaha; Smith Tempel Blaha LLC

(57) ABSTRACT

A component carrier has a laminated stack including at least one electrically conductive layer structure and/or at least one electrically insulating layer structure, a front-end chip on and/or in the stack and extending at least up to a main surface of the stack, an antenna interface on an opposing other main surface of the stack, and an impedance matching circuitry in the stack and arranged vertically between the front-end chip and the antenna interface.

19 Claims, 4 Drawing Sheets

(51) Int. Cl.
*H01Q 5/335* (2015.01)
*H01Q 23/00* (2006.01)
*H04B 1/04* (2006.01)

(52) U.S. Cl.
CPC ............. *H01Q 5/335* (2015.01); *H01Q 23/00* (2013.01); *H04B 1/04* (2013.01)

(58) Field of Classification Search
CPC ..... H01L 23/552; H01L 23/66; H05K 1/0218; H05K 1/0222; H05K 1/0243; H05K 3/4644; H05K 3/4697; H05K 2201/0723; H05K 2201/09481; H05K 2201/09809; H05K 2201/10098; H05K 2201/10545; H05K 1/183; H05K 1/188; H05K 1/025; H05K 1/18
USPC ........................................................ 343/702
See application file for complete search history.

(56) References Cited

U.S. PATENT DOCUMENTS

| | | | |
|---|---|---|---|
| 10,410,963 B1* | 9/2019 | Weis | H05K 1/186 |
| 10,888,002 B2* | 1/2021 | Wilfing | H05K 1/115 |
| 11,037,881 B2* | 6/2021 | Leitgeb | H01L 23/367 |
| 2004/0018814 A1* | 1/2004 | Lin | H05K 1/0237 |
| | | | 455/73 |
| 2007/0200748 A1 | 8/2007 | Hoegerl et al. | |
| 2008/0303120 A1 | 12/2008 | Lee et al. | |
| 2009/0212879 A1 | 8/2009 | Rofougaran | |
| 2011/0147920 A1 | 6/2011 | Alluri et al. | |
| 2011/0148545 A1 | 6/2011 | Alluri et al. | |
| 2012/0188138 A1 | 7/2012 | Liu | |
| 2015/0237712 A1 | 8/2015 | Tago | |
| 2018/0261566 A1* | 9/2018 | Babcock | H01L 25/18 |
| 2020/0111748 A1* | 4/2020 | Leitgeb | H05K 1/185 |
| 2020/0344869 A1* | 10/2020 | So | H05K 1/0277 |

* cited by examiner

COMPACT LAMINATED COMPONENT CARRIER WITH FRONT END CHIP AND IMPEDANCE MATCHING CIRCUITRY FOR ANTENNA COMMUNICATION

CROSS-REFERENCE TO RELATED APPLICATIONS

This application claims the benefit of the filing date of the European Patent Application No. 19 217 655.0, filed Dec. 18, 2019, the disclosure of which is hereby incorporated herein by reference.

TECHNICAL FIELD

The disclosure relates to a component carrier, to a smart device, to a method of manufacturing a component carrier, and to a method use.

BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, conventional component carriers for high frequency communication may be space consuming and may involve significant signal loss.

SUMMARY

There may be a need to provide a compact component carrier for high-frequency applications with low signal loss.

In order to satisfy the need mentioned above, a component carrier, a smart device, a method of manufacturing a component carrier, and a method of use according to the independent claims are provided.

According to an exemplary embodiment of the disclosure, a component carrier is provided, wherein the component carrier comprises a laminated stack comprising at least one electrically conductive layer structure and/or at least one electrically insulating layer structure, a front-end chip on and/or in the stack and extending at least up to a main surface of the stack, an antenna interface on an opposing other main surface of the stack, and an impedance matching circuitry in the stack and arranged vertically between the front-end chip and the antenna interface.

According to another exemplary embodiment of the disclosure, a smart device is provided which comprises a component carrier having the above-mentioned features.

According to still another exemplary embodiment of the disclosure, a component carrier having the above-mentioned features may be used for a high-frequency application and/or for a high-power application.

According to still another exemplary embodiment of the disclosure, a method of manufacturing a component carrier is provided, wherein the method comprises laminating a stack comprising at least one electrically conductive layer structure and/or at least one electrically insulating layer structure, mounting a front-end chip on and/or in the stack to extend at least up to a main surface of the stack, arranging an antenna interface on an opposing other main surface of the stack, and arranging an impedance matching circuitry in the stack vertically between the front-end chip and the antenna interface.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "high-frequency application" may particularly denote a task fulfilled by the component carrier or to which the component carrier contributes, wherein the task may relate to the handling of a radio frequency signal. Such a radio or high-frequency signal may be an electric or electromagnetic signal propagating along a wiring structure of a component carrier in a range of frequencies used for communications or other signals. In particular, a radio frequency (RF) signal may for example have a frequency in the range between 10 MHz and 300 GHz.

In the context of the present application, the term "front-end chip" may particularly denote an electronic component (more particularly a semiconductor chip) configured for carrying out front end processing tasks of a high frequency application, in particular communication application. In particular, such a front-end chip may include at least one filter (for instance a high pass filter, a low pass filter and/or a bandpass filter), a mixer for mixing signals and/or an ADC (analog-digital-converter). Thus, the front-end chip may process a front-end signal for example in the analog domain.

In the context of the present application, the term "antenna interface" may particularly denote an interface at which an antenna is connected or is connectable. Such an antenna may be provided for receiving and/or transmitting electromagnetic radiation including information concerning the content of a signal to be communicated between the component carrier and an electronic periphery. In one embodiment, the antenna may be directly assembled with the antenna interface, i.e., may be integrally formed with the antenna interface or may even constitute the antenna interface. In another embodiment however, the antenna interface may only provide an interface for connecting an external antenna, for instance an antenna provided in form of an antenna component or connected to the antenna interface via a socket-plug-connection.

In the context of the present application, the term "impedance matching circuitry" may particularly denote a semiconductor chip or a multi-constituent circuitry which provides for a matching of the impedances of the front-end chip and of an antenna connected or to be connected to the antenna interface. In particular, the resistance, the capacitance and/or the inductance between front-end chip and antenna may be matched to each other by the impedance matching circuitry. In different embodiments, an impedance matching may be achieved with copper circuitry (see for instance reference signs 104, 116 in FIG. 7), passive components (see for example capacitors 160, inductors 162 and resistors; while the former are shown in FIG. 8, the latter are not shown in FIG. 8 but may be implemented as well, or integrated passive devices (IPD, see for example reference sign 112 in FIG. 1).

In the context of the present application, the term "smart device" may particularly denote an electronic device with smart electronics capability. A smart device may be an electronic device which may be connected to other devices or networks via different wireless protocols (such as Bluetooth, Zigbee, NFC, Wi-Fi, Li-Fi, etc.) that may operate interactively and autonomously. For instance, the smart device may be one of the group consisting of a smartphone, a tablet, a phablet, a laptop, a game console, a smartcard, a smart doorbell, a smart lock, a small refrigerator, a smart watch, a smart band, a smart key chain, a smart speaker, a smart node, an IoT (Internet of Things) device, etc.

According to an exemplary embodiment of the disclosure, a component carrier (such as a printed circuit board (PCB) or an IC (integrated circuit) substrate) may be provided which realizes a communication system with front-end capability and impedance matching capability in a highly compact configuration which may be thermally efficient and which may be compatible with a smart operation. In particular, it may be advantageous to arrange the front-end chip and the antenna interface at two opposing main surfaces of the component carrier and to sandwich the impedance matching circuitry within the laminated stack of the component carrier in between. As a consequence, a very short connection path may be obtained by the mentioned vertically stacked constituents. This may result in a high signal quality, low loss and strong suppression of artefacts. Furthermore, such a component carrier may have a very flat and also laterally compact configuration allowing to integrate it even under limited space requirements, such as within the casing of a smart device.

In the following, further exemplary embodiments of the component carrier, the smart device, and the methods will be explained.

In an embodiment, an integrated ground layer, which may serve as part of an antenna, may be basically a copper layer additionally enabling a better thermal energy distribution through the whole module or component carrier. Therefore, thermal energy may be efficiently guided from the interior of the (for example PCB-type) component carrier to the ambient environment. In particular, the thermal energy may be coupled to a motherboard (for instance of PCB-type) on the one hand side, and the antenna configuration (especially a ground layer) may distribute the heat homogeneously over the whole module or component carrier and may also contribute to transfer the heat to the ambient.

In an embodiment, the front-end chip may be surface-mounted on the stack or may be accommodated in a cavity of the stack extending up to the main surface. When embedding the front-end chip in a cavity extending up to a main surface of the component carrier, the electric connection of the front-end chip to an electronic environment may be very simple. Such a configuration may also result in a flat design. While the beforementioned application may provide the most compact configuration, it may be alternatively possible to surface-mount the front-end chip on the stack which simplifies heat removal thereof during operation. In both configurations, a front-end chip may be easily substituted by another front-end chip (for instance to support another frequency regime or in terms of a redesign of the component carrier).

In an embodiment, the component carrier may comprise an antenna connected to the antenna interface. Hence, in the described embodiment, the antenna may form an integral part of the component carrier and may be integrally formed with the antenna interface.

In an embodiment, the antenna may be a patterned electrically conductive material or an antenna component. In such an embodiment, it may for instance be possible that the antenna is formed as one of the electrically conductive layer structures of the stack on an upper main surface thereof. This may allow manufacturing an integrally connected antenna with low effort and compact configuration. Alternatively, the antenna may be a separate component which may be for instance mounted on top of the stack, such as an antenna chip.

In an embodiment, patterned conductive layers, which may constitute said antenna or part thereof, may be produced in a way that very smooth surfaces are obtained, which may enable high signal transmission with very low losses. An appropriate production technique may be mSAP (modified semi-additive processing) which may enable to obtain highly defined copper paths with low surface roughness. Thus, the manufacturing of the module or component carrier may be done in a way to achieve low surface roughness which may result in a better signal performance especially for higher frequencies.

In an embodiment, the antenna interface may be a socket for connecting an antenna, in particular via an electric cable, via a flexible component carrier (for instance PCB) configuration (for instance in terms of mobile phone connections, etc.). In particular, the component carrier may comprise the antenna which may be equipped with a plug being connectable or connected to the socket, in particular in a substitutable way. In such a configuration, the antenna may be a separate component which may be attached to the antenna interface, for instance in a detachable way. For example, it may be possible to provide a separate antenna connected with an electric cable and a plug which may fit to a socket of the antenna interface, or vice versa. By taking this measure, the component carrier may be flexibly connected with different antenna types. This may provide a high flexibility of supporting different applications.

In an embodiment, the impedance matching circuitry may be configured for matching an impedance between the front-end chip and an antenna connected to the antenna interface. Impedance matching may denote an electronic design according to which an input impedance of an electrical load or an output impedance of its corresponding signal source may be adjusted to obtain a proper power transfer or reduce undesired signal reflection. By matching the impedance between front-end chip and antenna, artefacts in signals propagating from the front-end chip to the antenna, or vice versa, may be efficiently suppressed. As a consequence, signal distortions may be reduced and the signal quality may be improved.

In an embodiment, the impedance matching circuitry may be a Balun. A Balun ("balanced to unbalanced") may be denoted as an electric circuitry that may convert between a balanced signal and an unbalanced signal. A Balun may also include circuitry that transforms impedances. A Balun may be a specifically powerful implementation of an impedance matching circuit.

In an embodiment, the antenna structure, the impedance matching circuitry and the front-end chip may be vertically stacked, in particular electrically connected with each other by vertical through-connections. By vertically stacking antenna, impedance matching circuit and front-end chip, very short electric connection paths, which may in particular extend substantially vertically, may be obtained. Low surface roughness may also enable improved signal transmission with low losses. Both, short connection paths and copper surfaces with low surface roughness may allow for an enhanced signal transport with low losses. Thus, this may ensure a low loss signal transport and may simultaneously allow obtaining a highly compact configuration of the component carrier. Advantageously, front-end chip, impedance matching circuitry and antenna interface (optionally including an antenna) may also be horizontally aligned to obtain a highly compact configuration.

In an embodiment, the component carrier may comprise a shielding structure for shielding electromagnetic radiation between the impedance matching circuitry and/or the front-age upon the one hand and the antenna interface on the other hand. The shielding structure may be arranged on and/or in the stack and may in particular be integrally formed with the stack. In particular, such a shielding structure may be configured for absorbing and/or reflecting electromagnetic radiation (such as high frequency radiation) in a propagation path between impedance matching circuitry and antenna. By taking this measure, an undesired impact of electromagnetic radiation on the front-end chip may be efficiently suppressed. Thus, both electromagnetic radiation emitted by the antenna as well as electromagnetic radiation received by the antenna may be prevented from excessively propagating up to the front-end chip, which might deteriorate its functionality.

In an embodiment, the shielding structure may comprise at least one substantially continuous magnetic layer and/or at least one substantially continuous electrically conductive layer. A magnetic layer laminated into the stack of the component carrier may be a simply manufacturable and highly efficient way of preventing the propagation of electromagnetic radiation between antenna and front-end chip. For instance, a ferrite material or nanocrystalline magnetic particles or metal flake-based materials may be used for such a shielding structure. In particular, appropriate materials for the shielding structure are nano-crystalline soft magnetic materials like nano-crystalline alloys with the basic composition FeCuMSiB in which M can be one of the elements Nb, Ta, Mo, W or Zr. Also, amorphous metals (like for example ferrite) may be used for the shielding structure. It may also be possible to use metal-flake based materials. The general composition of such materials may be based on conductive solid fillers such as metallic powders, metal flakes, metal-coated fibers, metal nanowires and different carbon-based materials as carbon black, graphite, and graphene or carbon nano-tubes into a matrix. Deposited copper (for instance in form of one or more layers) may be used for ultra-high frequency applications. Alternatively, also a sufficiently thick copper layer or the like may be implemented between antenna and front-end chip for shielding electromagnetic radiation from propagating therebetween. Highly preferred may be a substantially continuous shielding layer, which may however be traversed by one or more small through-holes for guiding electric signals between the antenna, the impedance matching circuitry and/or the front-end chip.

In an embodiment, the component carrier may comprise a via-in-via. In particular, such a via-in-via structure may be configured for transporting an electric signal in a shielded fashion. Descriptively speaking, such a via-in-via configuration may function in a similar way as a coax cable on PCB scale which provides excellent shielding capabilities of signals conducted through the inner via of the via-in-via configuration. The exterior (for instance hollow cylindrical) via may then accomplish the shielding function. By taking this measure, the processing of electromagnetic radiation by the component carrier may be combined with a high signal quality of electric signals being conducted within the component carrier.

In an embodiment, the impedance matching circuitry may be configured as an impedance matching component (in particular an impedance matching semiconductor chip). In such an embodiment, a semiconductor die providing an impedance matching functionality may be embedded as a hole in the stack. Alternatively, the impedance matching circuitry may be an arrangement of circuit elements interconnected within the stack by the electrically conductive layer structure to thereby achieve an impedance matching function. In the latter mentioned embodiment, it may for instance be possible that a plurality of passive elements (such capacitor elements, resistor elements, inductor elements, etc.) are embedded in the stack and are interconnected by the wiring of the PCB in such a way that an impedance matching function may be obtained.

In an embodiment, the at least one electrically insulating layer structure may comprise a high-frequency dielectric. In the context of the present application, the term "high-frequency dielectric" may particularly denote an electrically insulating material which may have low loss properties when a high-frequency or radiofrequency signal propagates from or to an antenna structure in the direct environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. For instance, high-frequency dielectric material may have a dissipation factor of not more than 0.005, in particular of not more than 0.003, more particularly not more than 0.0015, at 10 GHz. The mentioned high frequency circuit materials may be for example ceramic-filled PTFE (polytetrafluoroethylene) composites. By providing at least part of the electrically insulating layer structures of a high-frequency dielectric, a low loss transport of even high-frequency signals may be enabled. It may also be possible that the high-frequency dielectric is a high-frequency capable prepreg, FR4 or ABF material. Such a high-frequency dielectric material may have a relative permeability $\varepsilon r$ in a range between 1.01 and 4. In a stack, one or more electrically insulating layer structures may be configured as a high-frequency dielectric.

In an embodiment, the main surface (relating to the front-end chip) of the component carrier may be mounted on a mounting base of the smart device. For instance, such a mounting base may be a further component carrier such as a printed circuit board (PCB). When one of the main surfaces of the flat component carriers is mounted on a flat mounting base of the smart device, a very flat overall configuration may be obtained, which may be highly advantageous for applications such as smartphones.

In a preferred embodiment, a side wall of the stack may comprise an electrically conductive connection structure for mounting and connecting the component carrier on a mounting base, in particular of a smart device. In such an embodiment, a side wall plating may be produced, i.e., an electrically conductive structure on a side wall of the component carrier. This side wall may be in electric contact with the front-end chip. With such a configuration, it may be possible to vertically mount a plate-shaped component carrier on a mounting base, which may be advantageous for instance in applications in which the assembly space on a main surface of the (for instance flat) mounting base may be limited. This may be highly advantageous for mobile phone applications or the like.

In an embodiment, the component carrier may be configured as one of the group consisting of a transceiver, a transmitter and a receiver. In other words, it may be possible that the antenna of the component carrier only receives electromagnetic radiation from an environment, only emits electro-magnetic radiation to an environment or carries out both tasks, i.e., emitting and receiving.

In an embodiment, the component carrier may be configured for communicating via a mobile communication network, a short-range network, LoRaWan, Sigfox, Zigbee, Bluetooth, or WiFi. However, the communication according to other wireless communication standards may be enabled by the component carrier as well.

In an embodiment, the stack may comprise at least one through hole being at least partially filled with an electrically conductive filling medium (such as plated copper) for electrically connecting opposing main surfaces of the stack. For instance, the through hole may be formed by laser processing or by mechanically drilling. The filling medium may be copper which may be inserted into the through hole for example by electroless deposition and/or plating. With such a plated via, a short vertical connection path between the two opposing main surfaces of the component carrier may be obtained which also suppresses signal loss. A short vertical connection path may also enable good temperature dissipation and temperature guidance towards the ambient environment. By that, signal loss may also be suppressed.

In an embodiment, the component carrier may be used for 5G (or higher). Mobile wireless communication according to the 5G standard may involve high-frequency transmission with a high transmitted data volume per time and therefore requires excellent properties in terms of high-frequency behavior. A component carrier according to an exemplary embodiment of the disclosure may meet these demanding requirements. Fifth generation (5G) networks feature an increased mobile data rate, in particular significantly above 100 Mb/s. Fifth generation communication networks may experience superior network transmission fidelity when implementing a component carrier according to an exemplary embodiment of the disclosure.

In an embodiment, the component carrier may be used for high-frequency applications above 1 GHz, in particular about 300 GHz. In particular for such high frequencies, signal transmission may be particularly sensitive to stub caused artefacts. The high RF performance of component carriers according to exemplary embodiments of the disclosure may allow low loss signal transmission even with such high-frequency values.

In an embodiment, the component carrier may comprise a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane. Preferably, a surface roughness of such a layer structure may be low, in order to obtain proper signal transmission at low loss in particular at high frequencies.

In an embodiment, the component carrier may be shaped as a plate. This may contribute to the compact design, wherein the component carrier may nevertheless provide a large basis for mounting components thereon. Furthermore, in particular a naked die as an example for an embedded electronic component, may be conveniently embedded, thanks to its small thickness, into a thin plate such as a printed circuit board.

In an embodiment, the component carrier may be configured as one of the group consisting of a printed circuit board, a substrate (in particular an IC substrate), and an interposer.

In the context of the present application, the term "printed circuit board" (PCB) may particularly denote a plate-shaped component carrier which may be formed by laminating several electrically conductive layer structures with several electrically insulating layer structures, for instance by applying pressure and/or by the supply of thermal energy. As preferred materials for PCB technology, the electrically conductive layer structures may be made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board may usually be configured for accommodating one or more components on one or both opposing surfaces of the plate-shaped printed circuit board. They may be connected to the respective main surface by soldering, sintering or thermal compression bonding. More generally, any one of soldering, sintering or thermal compression bonding may be used for establishing any connection of embodiments described herein. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate may be understood as a carrier for electrical connections or electrical networks as well as component carrier comparable to a printed circuit board (PCB), however with a considerably higher density of laterally and/or vertically arranged connections. Lateral connections may be for example conductive paths, whereas vertical connections may be for example drill holes. These lateral and/or vertical connections may be arranged within the substrate and may be used to provide electrical, thermal and/or mechanical connections of housed components or unhoused components (such as bare dies), particularly of IC chips, with a printed circuit board or intermediate printed circuit board. Thus, the term "substrate" may also include "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure may comprise at least one of the group consisting of resin (such as reinforced or non-reinforced resins, for instance epoxy resin or bismaleimide-triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg particularly FR4 may usually be preferred for rigid PCBs, other materials in particular epoxy-based build-up film or photo-imageable dielectric material may be used as well. For high-frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures may comprise at least one of the group consisting of copper, aluminum, nickel, silver, gold, palladium, and tungsten. Although copper may usually be preferred, other materials or coated versions thereof are possible as well, in particular coated with supra-conductive material such as graphene.

At least one component, which may be optionally surface mounted on and/or embedded in the stack, may be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component may be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element may be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or may be sensitive with regard to electromagnetic radiation propagating from an environment, may be used as component.

In an embodiment, the component carrier may be a laminate-type component carrier. In such an embodiment, the component carrier may be a compound of multiple layer structures which may be stacked and connected together by applying a pressing force and/or heat.

After processing interior layer structures of the component carrier, it may be possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it may be possible to proceed with a surface treatment of the obtained layers structures or component carrier.

In particular, an electrically insulating solder resist may be applied to one or both opposing main surfaces of the layer stack or component carrier in terms of surface treatment. For instance, it may be possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It may also be possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, which may make the component carrier less reliable. A surface finish may then be formed for instance as an interface between a surface mounted component and the component carrier. The surface finish may have the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the disclosure are apparent from the examples of embodiment to

DETAILED DESCRIPTION OF EXEMPLARY EMBODIMENTS

Figure 1:
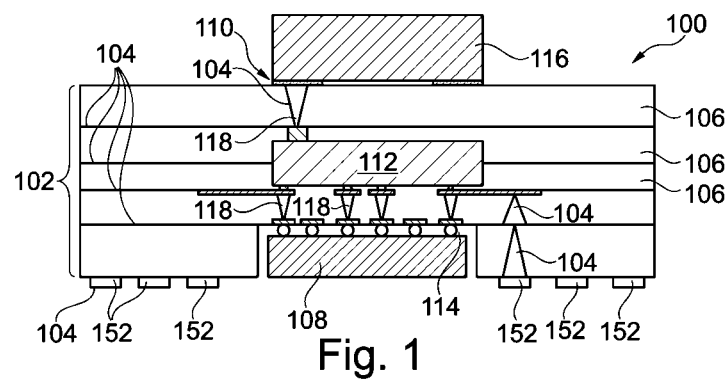
FIG. 1, FIG. 2, FIG. 3, FIG. 4, FIG. 5, FIG. 6 and FIG. 7 illustrate cross-sectional views of component carriers (or parts thereof, see FIG. 5 and FIG. 6) according to exemplary embodiments of the disclosure.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the disclosure have been developed.

According to an exemplary embodiment of the disclosure, a component carrier may be provided with integrated antenna or at least an antenna interface, impedance matching circuitry and front-end capability provided by a corresponding component or semiconductor chip. Highly advantageously, the mentioned constituents may be arranged on top of each other, with the impedance matching circuitry being sandwiched vertically in between antenna interface and front-end chip. This may ensure a very compact configuration and short signal paths. As a result, small losses may be achieved. Furthermore, a planar lower main surface of the, for instance, plate-shaped component carrier may be directly connected on a mounting base such as a further PCB. In order to increase the flexibility, the front-end chip may be accommodated in an exchangeable manner at a lower main surface of the component carrier, for instance surface-mounted or even more preferably in a cavity on the lower main surface. An impedance matching circuitry such as a Balun may be provided for adjusting the front-end properties to the antenna concerning their impedance properties. The front end may be the interface between a high frequency signal and a carrier or base band signal. The antenna may for instance be an etched copper layer or may be provided as SMD (surface mounted device), such as a ceramic component. Further alternatively, the antenna may be externally connected to the antenna interface via a cable connection or via a flexible PCB. In particular with respect to smart-phone applications, a flex PCB may be used in order to connect the antenna interface with the antenna module.

According to an exemplary embodiment of the disclosure, a high frequency transceiver module with cavity for an RF-amplifier may be provided. A corresponding component carrier may be configured as a micro-communication module for short ranges so that only a data signal and power may have to be provided. Hence, a highly integrated, miniaturized communication module with simply manufacturable build-up may be provided. Exemplary applications of exemplary embodiments of the disclosure may be modules for 5G, WiGig (802.11ad), GPS (Global Positioning System), radar communications, etc.

A gist of an exemplary embodiment may be the provision of a component carrier combining a via-in-via communication arrangement between a front-end chip and an antenna interface connectable or connected to an antenna, an antenna in a package having a cavity, a Balun or another impedance matching circuitry, and also including one or more optional passive elements (like capacitors). An exemplary embodiment may provide a HF (high-frequency) transceiver package.

By exemplary embodiments of the disclosure, various advantageous elements may be implemented: In particular, a via-in-via configuration may be provided in which the exterior via may function as a shielding and the interior via may function as a signal transporting element. An antenna of such a component carrier may be embodied for instance as a discrete element or as a copper loop in the laminate-type package. Moreover, one or more optional passive components may be integrated in the, for instance PCB-type component carrier, in particular to stabilize the power supply of the chip. By arranging a front-end chip so that it extends up to a main surface of the component carrier, a chip last architecture may be implemented in which most valuable components may be assembled a very late stage of the manufacturing process. Such an architecture of a front-end chip reaching up to a main surface of the component carrier may also allow a simple substitution of the front-end chip, for instance for a redesign or for supporting different applications.

In an embodiment, it may be possible to mount the front-end chip by thermo-compression bonding or by soldering a BGA (ball-grid array) package into or onto the cavity. Soldering may be a very easy way of accomplishing this task, as no solder paste may be necessary for BGA package soldering. For properly assembling a loop antenna, the use of high frequency materials may be advantageous, in particular for the dielectric layer structures of the component carrier.

Advantageously, frequencies of modern applications (for instance in terms of 5G) may be so high that the antenna dimensions may become so small that they may be properly integrated in the component carrier. This may further increase the compactness. In particular, the above-mentioned cable which may be used for connecting an external antenna to the antenna interface may be a coax cable for accomplishing a proper shielding.

Exemplary applications of exemplary embodiments of the disclosure may be applications in terms of IOT (Internet of Things). For instance, such component carriers may be advantageously implemented in home appliances, such as white good applications, smart device applications, or other bus applications of such smart home appliances.

According to an exemplary embodiment of the disclosure, a high-frequency transceiver module embodied in component carrier technology may be provided, which may be implemented for instance in an RF amplifier. Advantageously, at least one of the constituents of such a component carrier, preferably a front-end chip, may be implemented in a cavity formed in a surface portion of the stack of the laminated component carrier. In other words, the component carrier may be assembled by connecting layer structures by mechanical pressure and/or heat.

For mobile applications, small power amplifier modules with integrated antennas become more and more important. An exemplary embodiment of the disclosure may provide a PCB-based module with a cavity formed at a bottom side to solder a for instance BGA-based high frequency transceiver package and may connect solder pads with RF vias to an antenna structure on top of the package.

Modern electronic devices may be created based on a combination of varying packed modules. Usually, a PCB or another mounting base may be implemented to carry components and connect signals as well as power together. A module may not be necessarily an overmolded metal carrier, it may also be a printed circuit board with embedded or cavity-mounted components. Signal transmission at high frequencies (for instance 25 GHz and above) may be provided to realize high-speed connections over short spatial ranges. Such modules may need a signal amplifier, an antenna adaptation network (for instance a Balun) and the antenna itself. Due to the high frequencies, the antenna structure may be very small. All described components packed into one printed circuit board may allow providing a high frequency transceiver module. To get a directed signal out of the antenna, a special layer with a magnetic core material (for instance nano-crystalline) may be advantageously used instead of prepreg or ABF material in the component carrier stack below the antenna.

FIG. 1 illustrates a cross-sectional view of a component carrier 100 according to an exemplary embodiment of the disclosure.

According to FIG. 1, a laminate-type component carrier 100 may be provided which may be configured as a plate-shaped PCB (printed circuit board) or IC (integrated circuit) substrate. In the shown embodiment, the component carrier 100 may be configured as a transceiver having both transmitter and receiver capability. For instance, the component carrier 100 may be configured for communicating via a mobile communication network, Bluetooth and/or WiFi. The component carrier 100 may also be configured for a high frequency application, such as 5G (or higher subsequent versions).

The component carrier 100 may comprise a laminated stack 102 comprising electrically conductive layer structures 104 and electrically insulating layer structures 106. Lamination may particularly denote the connection of the layer structures 104, 106 by the application of pressure and/or heat.

The electrically insulating layer structures 106 may for instance comprise resin (such as epoxy resin), optionally comprising reinforcing particles such as glass fibers. For instance, the electrically insulating layer structures 106 may be made of prepreg. It may also be possible that at least part of the material of the electrically insulating layer structures 106 may be a high-frequency dielectric having a lower high-frequency loss than standard prepreg material of a stack of component carrier material (for instance RO3003™ material, as commercialized by the company Rogers Corporation). By taking this measure, the component carrier 100 may be rendered highly appropriate for high-frequency applications.

The electrically conductive layer structures 104 may be patterned copper layers laminated with the electrically insulating layer structures 106 and/or may be plated copper structures.

A front-end chip 108, embodied as a semiconductor chip, may be accommodated in a cavity 114 of the stack 102 and may extend up to a lower main surface of the stack 102. As can be taken from FIG. 1, the front-end chip 108 may be accommodated in cavity 114 of the stack 102 and may extend up to the lower main surface so that an exposed main surface of the front-end chip 108 may be substantially in flush with or aligned with a lower main surface of the stack 102. This may simplify substitution of the front-end chip 108, for instance for a redesign of the component carrier 100 or for another high-frequency application.

An antenna interface 110 may be arranged on an opposing other (according to FIG. 1 upper) main surface of the stack 102. More specifically, the component carrier 100 of FIG. 1 may comprise an antenna 116 connected to the antenna interface 110, i.e., antenna 116 may be embodied as a surface mounted device. More specifically, the illustrated antenna 116 may here be configured as a chip antenna.

Furthermore, an impedance matching circuitry 112 may be provided as part of the component carrier 100 and may be embedded in a central portion of the stack 102. According to FIG. 1, impedance matching circuitry 112 may be realized by an IPD (integrated passive device). As shown, the impedance matching circuitry 112 may be vertically sandwiched between the front-end chip 108 and the antenna interface 110. The impedance matching circuitry 112 may be configured for matching an impedance between the front-end chip 108 and the antenna 116 connected to the antenna interface 110. The impedance matching circuitry 112 may be configured as a Balun. In the shown embodiment, the impedance matching circuitry 112 may be configured as an impedance matching semiconductor chip providing an impedance matching functionality when embedded as a whole in the stack 102. Thus, the Balun may here be configured as a component which may be embedded in the module-type component carrier 100.

As shown, the antenna interface 110, the impedance matching circuitry 112 and the front-end chip 108 may be vertically stacked above each other and may advantageously be electrically connected with each other substantially exclusively by vertical through connections 118 (compare FIG. 1). This may keep the component carrier 100 compact and the signal paths short. This may result, in turn, in low losses.

Hence, FIG. 1 shows a cross-sectional view of a PCB (printed circuit board) type laminated component carrier 100 being shaped as a plate. Impedance matching circuitry 112 may be embedded in a central portion of the stack 102. On a lower main surface of the laminated stack 102, cavity 114 may be formed in which front-end chip 108 may be accommodated with exterior access from a bottom side of the component carrier 100. The cavity 114 may be formed for example by embedding in the stack 102 a poorly adhesive layer, for instance made of a waxy material or Teflon®. Subsequently, a circumferential cut may be made from a lower main surface of the stack 102, for instance with a laser, to thereby cut out a piece of the stack 102 which may be delimited circumferentially by the laser cutting line and horizontally by the poorly adhesive layer. As a result, cavity 114 may be formed. Thereafter, the front-end chip 108 may be inserted into the so formed cavity 114.

As shown, the antenna 116 of FIG. 1 may be a surface-mounted device, for instance a ceramic antenna, on the stack 102.

Vertically in between the antenna 116 and the front-end chip 108 may be the impedance matching circuitry 112, which may be configured as a Balun component.

As shown as well in FIG. 1, substantially vertical through-connections 118 may be formed as part of the electrically conductive layer structures 104 so as to connect constituents 108, 112 and 116 in the vertical direction so that a substantially vertical signal flow may be enabled. This may keep the component carrier 100 compact and the signal quality high.

Moreover, electrically conductive pads 152 may be formed on a lower main surface of the component carrier 100. By the pads 152, the component carrier 100 may be mounted and simultaneously electrically connected with a mounting base (see reference sign 124 in FIG. 9) such as a printed circuit board.

In a receiving mode of a transceiver-type component carrier 100 or in a receiver-type component carrier 100, a wireless signal in form of electromagnetic radiation may be captured by the antenna 116 and may be conducted by the impedance matching circuitry 112 to the front-end chip 108 for further processing. In a transmitting mode of a transceiver-type component carrier 100 or in a transmitter-type component carrier 100, an electric signal may be created by the front-end chip 108 and may be transmitted by the impedance matching circuitry 112 to the antenna 116 for transmission in form of electromagnetic radiation.

Another advantageous feature of the build-up may be the use of thermally conductive adhesives as an underfill material for the semiconductor chip. These adhesives may increase the adhesion between the chip and the PCB and may additionally enhance the thermal energy distribution. In particular, it may be possible to provide a thermal grease between the chip backside and the main PCB (motherboard) to improve the thermal path from the module to the motherboard. A thermal grease may be an underfill with enhanced thermal performance. Voids between the semiconductor chip and the cavity may be filled with an underfill material (thermally conductive adhesive) which may additionally exhibit a thermal conductivity of up to 10 W/mK, in particular up to 20 W/mK, or more. Thereby, the thermal energy distribution may be enhanced.

Figure 2:
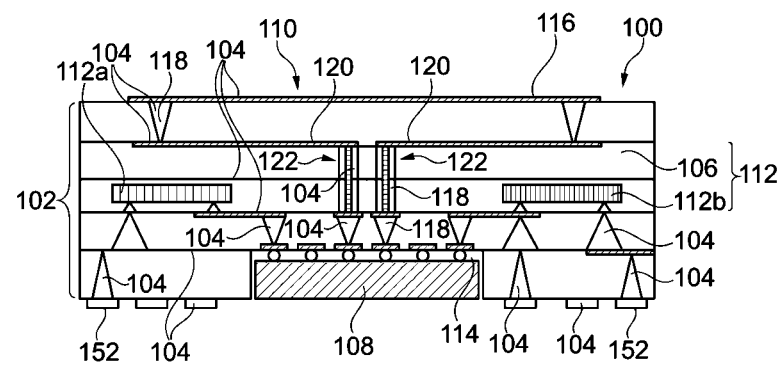

FIG. 2 illustrates a cross-sectional view of a component carrier 100 according to another exemplary embodiment of the disclosure.

According to FIG. 2, the antenna 116 may be a loop antenna which may for instance be formed by patterned electrically conductive material of the electrically conductive layer structures 104. Such a configuration may be particularly compact and simple in manufacture.

Moreover, a shielding structure 120 for shielding electromagnetic radiation between the impedance matching circuitry 112 and the front-end chip 108 on the one hand, and the antenna 116 on the other hand may be provided. More specifically, the shielding structure 120 may be embodied as a substantially continuous magnetic layer or a substantially continuous electrically conductive layer. In order to electrically shield the antenna 116, which may be embodied as patterned copper layer(s) on top of the stack 102 according to FIG. 2, with respect to the front-end chip 108, a layer of a magnetic material may be embedded in the stack 102 to thereby form magnetic shielding 120. Consequently, electromagnetic radiation may be prevented from propagating between the antenna 116 and the front-end chip 108, which may improve the signal quality.

Furthermore, the component carrier 100 of FIG. 2 may comprise a via-in-via 122 forming part of the vertical through-connections 118. With such a via-in-via 122, a transmitted signal may be properly shielded with respect to an electronic environment. The vertical arrangement of the via-in-via 122 may keep the signal paths short and high-frequency losses small. Thus, FIG. 2 illustrates that some of the vertical through-connections 118 of the electrically conductive layer structures 104 may be configured as via-in-via 122. Such a via-in-via structure may function as a coax cable and may therefore further improve the shielding of signals propagating along the central electrically conductive core of the via-in-via 122.

In the embodiment of FIG. 2, the impedance matching circuit 112 may not be realized as a single embedded semiconductor component as in FIG. 1, but as a combination of one or more resistor components, one or more inductance components and/or one or more capacitor components cooperating with electric circuitry constituted by the electrically conductive layer structures 104 to thereby form impedance matching circuitry 112. In other words, the impedance matching circuitry 112 of FIG. 2 may be configured as an arrangement of circuit elements of the stack 102 and may be formed by the electrically conductive layer structures 104. Said plurality of capacitor elements, resistor elements, inductor elements, etc. may form part of the stack 102 and may be interconnected by the wiring of the PCB in such a way that an impedance matching function is achieved.

The configuration according to FIG. 2 may be used particularly advantageously for high frequency applications. It may be possible that there may be no dedicated die or passive component installed. The copper structure itself may act as a balun between the antenna 116 and the front-end chip 108.

The additionally shown components 112a, 112b may be installed to stabilize the power supply for the front-end chip 108. For instance, components 112a, 112b may exhibit a low-pass filter, a high-pass filter or a bandpass filter.

Figure 3:
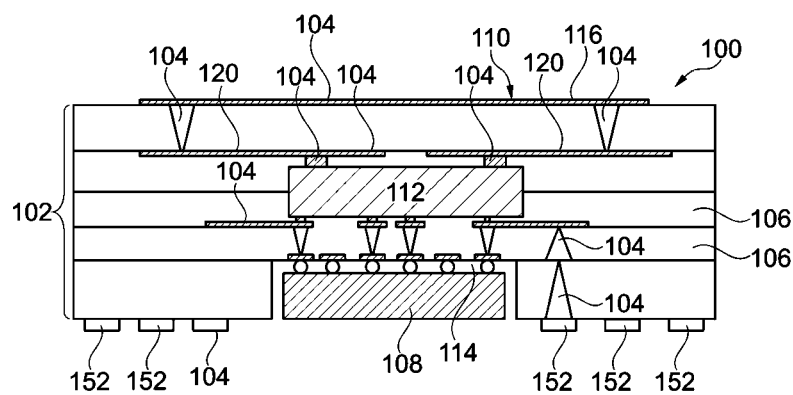

A component carrier 100 according to another exemplary embodiment shown in FIG. 3 differs from the component carrier 100 shown in FIG. 2 in that, according to FIG. 3, the impedance matching circuitry 112 may here be embodied as an embedded component. The latter may be vertically sandwiched between the front-end chip 108 and the antenna 116. The latter may again be manufactured as a patterned electrically conductive layer structure 104 on top of the stack 102. Also, in FIG. 3, the signal propagation paths may be short due to the substantially vertical electric connection circuitry.

Figure 4:
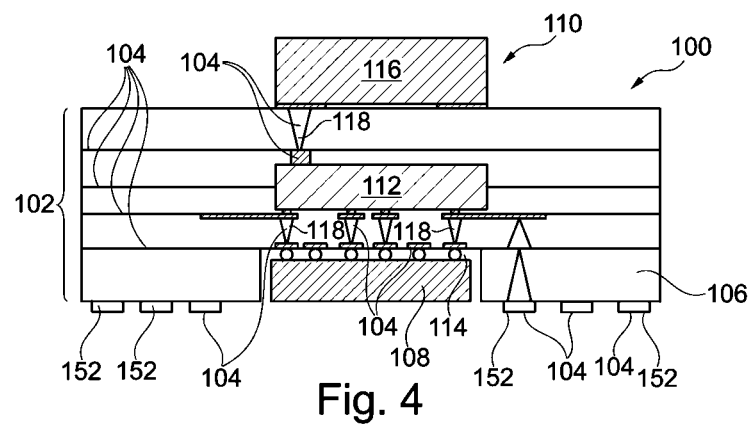

The exemplary embodiment of the disclosure according to FIG. 4 differs from the embodiment in FIG. 3 in particular in that the antenna 116 may not be embodied as a structured metal layer on top of the stack 102, but in contrast to this as an antenna component. Said antenna component may for instance be a ceramic component surface mounted on the stack 102 to provide an antenna function.

Figure 5:
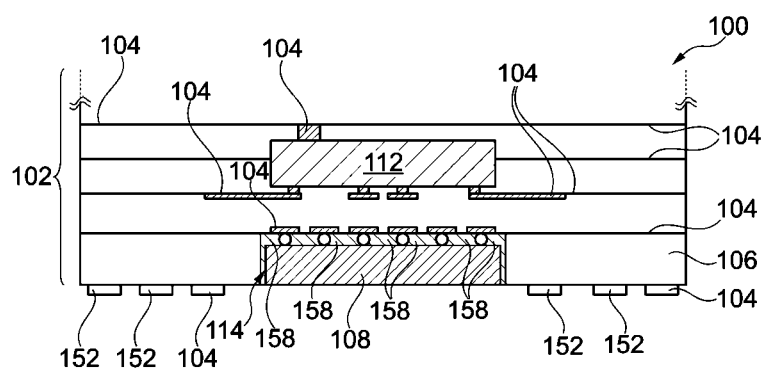

FIG. 5 shows only part of a component carrier 100 according to another exemplary embodiment of the disclosure illustrating that the cavity 114 accommodating the front-end chip 108 may also be filled with an underfill material 158. In the embodiment of FIG. 5, the mechanical coupling of the front-end chip 108 accommodated in the cavity 114 may thus be further improved by providing the adhesive or underfill material 158. This may improve the thermal performance and the mechanical integrity of the component carrier 100 shown in FIG. 5.

Figure 6:
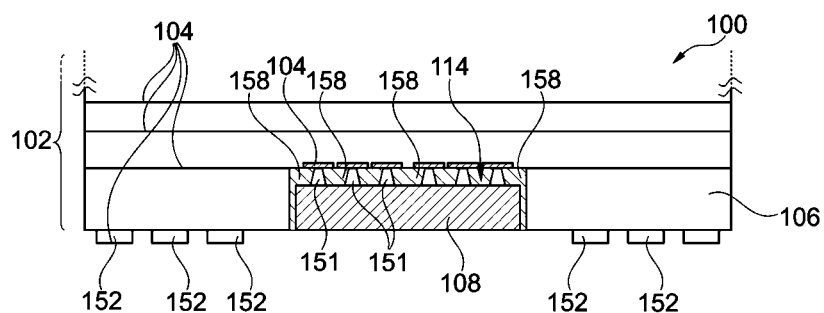

FIG. 6 shows only part of a component carrier 100 according to an exemplary embodiment of the disclosure illustrating that the connection of the front-end chip 108 within the stack 102 may also be accomplished by copper pillars 151.

Figure 7:
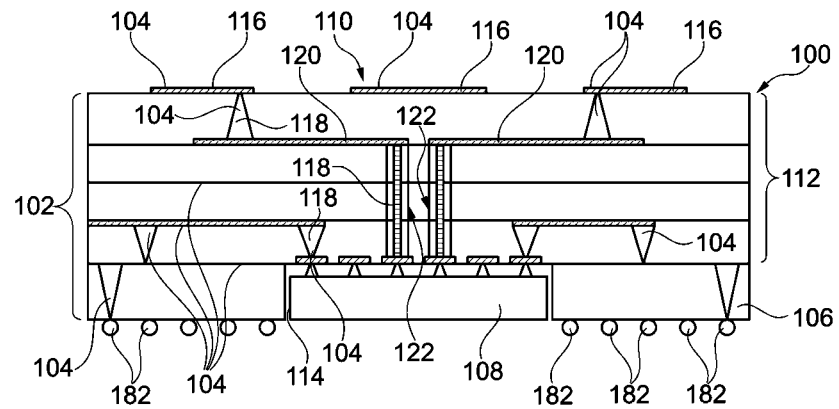

In the embodiment of FIG. 7, a schematically indicated impedance matching circuitry 112 may be formed by a corresponding configuration of the electrically conductive layer structures 104 of the stack 102. According to FIG. 7, the copper circuitry (see reference signs 104, 116) may contribute to impedance matching.

The antenna 116 may again be formed as a patterned planar electrically conductive layer structure 104 on top of the stack 102, i.e., as an antenna structure. Therefore, the configuration of FIG. 7 may be particularly compact.

The front-end chip 108 may be accommodated within a cavity 114 on the back side of the stack 102.

Figure 9:
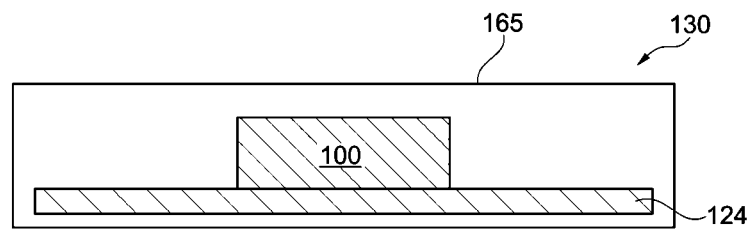
FIG. 9 illustrates a cross-sectional view of a smart device according to an exemplary embodiment of the disclosure.

A bottom of the component carrier 100 of FIG. 7 may be provided with a connection structure 182 which may be configured for establishing a mechanical and an electrical connection to a mounting base 124 or carrier (see FIG. 9). For instance, such a connection may be a QFN (Quad Flat No Leads Package) connection, a BGA (Ball Grid Array) connection, etc.

Figure 8:
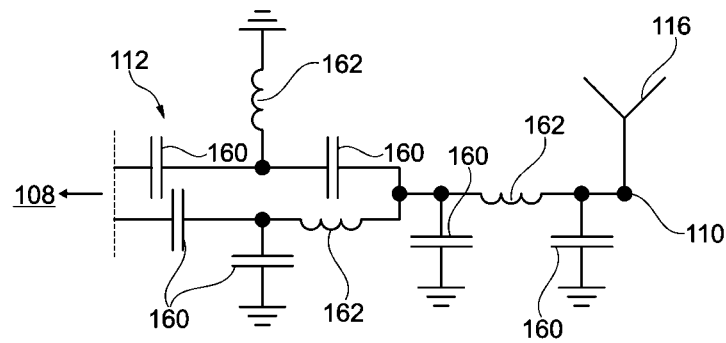
FIG. 8 illustrates a circuitry of a Balun which may be implemented in a component carrier according to an exemplary embodiment of the disclosure.

FIG. 8 illustrates a circuitry of a Balun which may be implemented as impedance matching circuitry 112 in a component carrier 100 according to an exemplary embodiment of the disclosure. As indicated schematically in FIG. 8, the impedance matching circuitry 112 may be sandwiched between an antenna 116 and a front-end chip 108. The Balun circuitry may be composed of capacitors 160 and inductors 162 connected between the antenna 116 and the front-end chip 108 and being partially grounded.

A skilled person will understand that other configurations of the impedance matching circuitry 112 may be possible as well. For instance, the illustrated passive components in FIG. 8 (like capacitors 160 and inductors 162) may contribute to impedance matching. However, also ohmic resistors, not shown in FIG. 8, may form part of impedance matching circuitry 112.

FIG. 9 illustrates a smart device 130 according to an exemplary embodiment of the disclosure. For instance, the illustrated smart device 130 may be a smartphone, a tablet, a phablet, a laptop, or a game console. The illustrated smart device 130 may comprise a component carrier 100, for instance one of the component carriers 100 described above referring to FIG. 1 to FIG. 7. According to FIG. 9, the main surface of the component carrier 100 at which the front-end chip 108 may be exposed may be mounted on a mounting base 124 of the smart device 130. The cross-sectional view of FIG. 9 shows that the smart device 130 may be implemented in a very flat configuration. For instance, the flat component carrier 100 may be surface-mounted on the flat mounting base 124, such as a printed circuit board, within a casing 165 of the smart device 130. Hence, the component carrier 100 may provide its transceiver functionality with integrated front end processing and impedance matching capability even under very limited space conditions.

Figure 10:
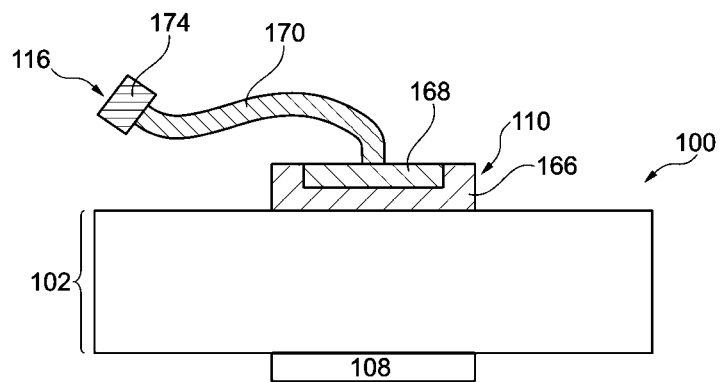
FIG. 10 to FIG. 11 illustrate cross-sectional views of component carriers according to other exemplary embodiments of the disclosure.

FIG. 10 illustrates a cross-sectional view of a component carrier 100 according to another exemplary embodiment of the disclosure. According to FIG. 10, the antenna interface 110 may be a socket 166 for connecting an antenna 116 via an electric cable 170. The socket 166 may have an accommodation opening configured for receiving an inversely shaped plug 168 connected via coax cable 170 to the external antenna 116 embodied as antenna component 174. For instance, the external antenna component 174 may be a ceramic antenna. By taking this measure, one and the same component carrier 100 with integrated front end processing and impedance matching capability may be flexibly connected to different antenna components 174, depending on the requirements of a specific application.

According to FIG. 10, the front-end chip 108 may be surface-mounted on a lower main surface of the stack 102 to thereby protrude beyond a lower main surface of the stack 102. Also, in this configuration the front-end chip 108 may be properly accessible.

Figure 11:
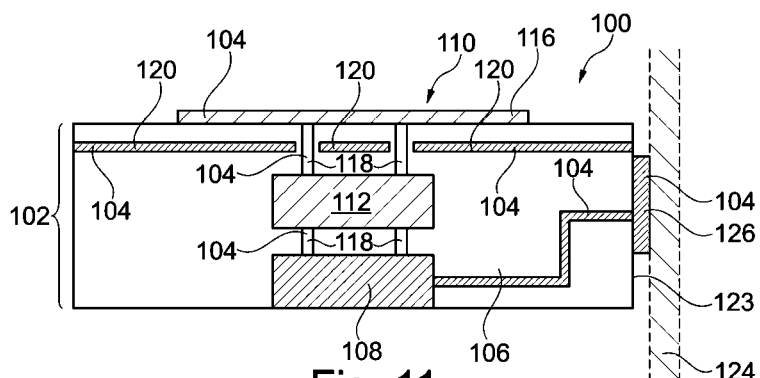

FIG. 11 illustrates a cross-sectional view of a component carrier 100 according to another exemplary embodiment of the disclosure. In the embodiment of FIG. 11, a side wall 123 of the stack 102 may comprise an electrically conductive connection structure 126 configured for mounting and connecting the component carrier 100 on a mounting base 124 of a smart device 130, or on another electronic component or carrier. FIG. 11 thus shows a configuration at which a side wall plating of the component carrier 100 may be realized as electrically conductive connection structure 126. In other words, side wall 123 of the stack 102 may be plated with electrically conductive material to thereby form the connection structure 126. For implementing the shown component carrier 100 in a smart device 130, it may for instance be possible to vertically mount the component carrier 100 so that the side wall plating may be arranged on an upper main surface of a mounting base 124.

Figure 12:
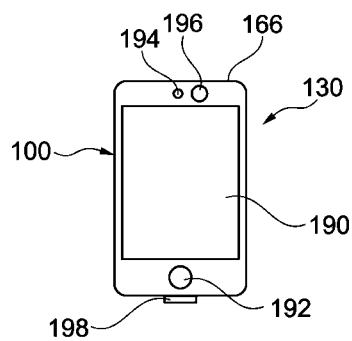
FIG. 12 illustrates a smart device according to an exemplary embodiment of the disclosure.

FIG. 12 shows a smart device 130 according to an exemplary embodiment of the disclosure embodied as a smartphone. As shown, one or more component carriers 100 of the above-described type may be implemented in the smart device 130. For instance, the smart device 130 may have a touchscreen 190, a control button 192, a camera 194, a loudspeaker 196 and a microphone 198, etc.

In particular for ultra-high frequencies, a balun network may be also included in the front-end chip 108. By this configuration, the production and testing may get easier. Every part may be tested during the production cycle as the embedding (balun die) or the copper structure to balance. The antenna 116 may be tested before the front-end chip 108 is installed in the component carrier 100. After installing the front-end chip 108, the overall configuration may be testable. Reference is made for instance of the embodiment of FIG. 2.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a laminated stack comprising at least one electrically conductive layer structure and/or at least one electrically insulating layer structure;
   a front-end chip on and/or in the laminated stack and extending at least up to a main surface of the laminated stack;
   an antenna interface on an opposing other main surface of the laminated stack; and
   an impedance matching circuitry in the laminated stack and arranged vertically between the front-end chip and the antenna interface:
   wherein the front-end chip, the antenna interface, and the impedance matching circuitry are arranged on top of each other, so that the impedance matching circuitry is placed vertically in between the antenna interface and the front-end chip.

2. The component carrier according to claim 1, wherein the front-end chip is surface-mounted on the stack to thereby protrude beyond the stack.

3. The component carrier according to claim 1, wherein the front-end chip is accommodated in a cavity of the stack so that an exposed surface of the front-end chip is aligned with said main surface of the stack.

4. The component carrier according to claim 1, wherein the component carrier comprises an antenna connected to the antenna interface.

5. The component carrier according to claim 4, wherein the antenna is a patterned electrically conductive structure or an antenna component.

6. The component carrier according to claim 1, wherein the antenna interface is a socket for connecting an antenna via an electric cable.

7. The component carrier according to claim 6, further comprising:
a plug connectable or connected to the socket.

8. The component carrier according to claim 1, comprising one of the following features:
wherein the impedance matching circuitry is configured as an impedance matching component, in particular an impedance matching semiconductor chip;
wherein the impedance matching circuitry is configured as an arrangement of circuit elements interconnected within the stack by the at least one electrically conductive layer structure.

9. The component carrier according to claim 1, wherein the impedance matching circuitry is a Balun realized by a circuitry formed by at least part of the electrically conductive layer structures.

10. The component carrier according to claim 1, wherein the vertically stacked antenna interface, impedance matching circuitry and front-end chip are electrically interconnected with each other by vertical through-connections.

11. The component carrier according to claim 1, comprising at least one of the following features:
a shielding structure on and/or in the stack and configured for shielding electromagnetic radiation between at least one of the impedance matching circuitry and the front-end chip and the antenna interface,
wherein the shielding structure comprises at least one of the group consisting of at least one substantially continuous magnetic layer, and at least one substantially continuous electrically conductive layer;
wherein the component carrier comprises a via-in-via extending vertically along at least part of the stack, the via-in-via configured for transporting an electric signal in a shielded fashion;
wherein a side wall of the stack comprises an electrically conductive connection structure configured for mounting and connecting the component carrier on a mounting base of a mobile phone.

12. The component carrier according to claim 1, comprising at least one of the following features:
wherein the component carrier is configured as one of the group consisting of a transceiver, a transmitter and a receiver;
wherein the component carrier is configured for communicating via at least one for group consisting of a mobile communication network, a short-range network, LoRaWan, Sigfox, Zigbee, Bluetooth, and WiFi.

13. The component carrier according to claim 1, comprising at least one of the following features:
a thermally conductive adhesive as an underfill material between the front-end chip and the stack;
wherein the at least one electrically conductive layer structure comprises at least one of the group consisting of copper, aluminum, nickel, silver, gold, palladium, and tungsten;
wherein the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the at least one electrically insulating layer structure comprises a high-frequency dielectric.

14. The component carrier according to claim 1, comprising at least one of the following features:
wherein the component carrier is shaped as a plate;
wherein the component carrier is configured as one of the group consisting of a printed circuit board, and a substrate;
wherein the component carrier is configured as a laminate-type component carrier.

15. A smart device, comprising:
at least one component carrier having
a laminated stack comprising at least one electrically conductive layer structure and/or at least one electrically insulating layer structure;
a front-end chip on and/or in the laminated stack and extending at least up to a main surface of the laminated stack;
an antenna interface on an opposing other main surface of the laminated stack; and
an impedance matching circuitry in the laminated stack and arranged vertically between the front-end chip and the antenna interface:
wherein the front-end chip, the antenna interface, and the impedance matching circuitry are arranged on top of each other, so that the impedance matching circuitry is placed vertically in between the antenna interface and the front-end chip.

16. The smart device according to claim 15, comprising at least one of the following features:
the smart device is configured as one of the group consisting of a smartphone, a tablet, a phablet, a laptop, and a game console;
the smart device comprises a mounting base on which the at least one component carrier is mounted.

17. A method of manufacturing a component carrier, comprising:
laminating a stack comprising at least one electrically conductive layer structure and/or at least one electrically insulating layer structure;
mounting a front-end chip on and/or in the stack to extend at least up to a main surface of the stack;
arranging an antenna interface on an opposing other main surface of the stack; and
arranging an impedance matching circuitry in the stack vertically between the front-end chip and the antenna interface,
wherein the front-end chip, the antenna interface, and the impedance matching circuitry are arranged on top of each other, so that the impedance matching circuitry is placed vertically in between the antenna interface and the front-end chip.

18. A method, comprising:
providing a laminated stack of at least one electrically conductive layer structure and/or at least one electrically insulating layer structure;
mounting a front-end chip on and/or in the laminated stack;

arranging an antenna interface on an opposing other main surface of the laminated stack;

arranging an impedance matching circuitry in the laminated stack vertically between the front-end chip and the antenna interface such that the antenna interface and impedance matching circuitry overlap the front-end chip; and using the front-end chip and the antenna interface for a high-frequency application and/or for a high-power application.

19. The method according to claim 18, comprising at least one of the following features:

wherein the component carrier is used for wireless communication according to 5G;

wherein the component carrier is used for a high-frequency application in a frequency range above 1 GHz;

wherein the component carrier is used for a high-frequency application in a wavelength range between micrometers and millimeters, or below.

\* \* \* \* \*